United States Patent
Lin

(10) Patent No.: US 11,843,356 B2
(45) Date of Patent: Dec. 12, 2023

(54) RADIO-FREQUENCY POWER AMPLIFIER WITH AMPLITUDE MODULATION TO AMPLITUDE MODULATION (AMAM) COMPENSATION

(71) Applicant: Apple Inc., Cupertino, CA (US)

(72) Inventor: Saihua Lin, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/688,652

(22) Filed: Mar. 7, 2022

(65) Prior Publication Data

US 2023/0093489 A1  Mar. 23, 2023

Related U.S. Application Data

(60) Provisional application No. 63/246,549, filed on Sep. 21, 2021.

(51) Int. Cl.
*H03F 3/24* (2006.01)
*H04B 1/04* (2006.01)

(52) U.S. Cl.
CPC .............. *H03F 3/245* (2013.01); *H04B 1/04* (2013.01); *H03F 2200/451* (2013.01); *H04B 2001/045* (2013.01)

(58) Field of Classification Search
CPC . H01L 23/66; H01L 29/20; H03F 1/02; H03F 1/34; H03F 3/19; H03F 3/21; H03F 3/24; H03F 3/193; H03F 3/195; H03F 3/245; H03F 2200/451; H04B 1/04; H04B 1/10; H04B 1/16; H04B 17/21; H04B 2001/045; H04M 1/00

USPC ........ 327/355; 330/149, 195, 250, 277, 278, 330/288, 291, 311; 375/219, 295–297

See application file for complete search history.

(56) References Cited

U.S. PATENT DOCUMENTS

| | | |
|---|---|---|
| 8,737,526 B2 | 5/2014 | Coan et al. |
| 9,031,521 B2 | 5/2015 | Yang et al. |
| 9,197,168 B2 | 11/2015 | Al-Qaq et al. |
| 2015/0340999 A1 | 11/2015 | Kanaya |
| 2017/0302230 A1 | 10/2017 | Lehtola et al. |
| 2019/0173439 A1* | 6/2019 | Dunworth ............... H03F 1/565 |
| 2022/0247358 A1* | 8/2022 | Salameh ............. H03F 3/45183 |

* cited by examiner

*Primary Examiner* — Shawkat M Ali
(74) *Attorney, Agent, or Firm* — TREYZ LAW GROUP; Jason Tsai

(57) ABSTRACT

An electronic device may include wireless circuitry with a processor, a transceiver, an antenna, and a front-end module coupled between the transceiver and the antenna. The front-end module may include one or more power amplifiers for amplifying a signal for transmission through the antenna. A power amplifier may include an amplitude modulation distortion compensation circuit coupled to the input of the power amplifier. The compensation circuit may include adaptive biasing transistors each having a first source-drain terminal coupled to the input of the power amplifier, a second source-drain terminal coupled to a supply voltage, and a gate terminal configured to receive a control voltage via a big resistor. The control voltage can be set to a voltage level so that the adaptive biasing transistors are only turned on when the voltage swing at the input of the power amplifier is relatively large.

20 Claims, 8 Drawing Sheets

RADIO-FREQUENCY POWER AMPLIFIER WITH AMPLITUDE MODULATION TO AMPLITUDE MODULATION (AMAM) COMPENSATION

This application claims the benefit of provisional patent application No. 63/246,549, filed Sep. 21, 2021, which is hereby incorporated by reference herein in its entirety.

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to transmit and receive radio-frequency signals.

Radio-frequency signals transmitted by an antenna are often fed through one or more power amplifiers, which are configured to amplify low power analog signals to higher power signals more suitable for transmission through the air over long distances. It can be challenging to design a satisfactory power amplifier for an electronic device.

SUMMARY

An electronic device may include wireless communications circuitry. The wireless communications circuitry may include a processor for generating digital (baseband) signals, a transceiver for receiving the digital (baseband) signals and for generating corresponding radio-frequency signals, and one or more power amplifiers configured to amplify the radio-frequency signals for transmission by one or more antenna in the electronic device. The power amplifier may include an amplitude modulation to amplitude modulation (AMAM) distortion compensation circuit. The AMAM distortion compensation circuit may be coupled to the input terminals of the power amplifier and may include adaptive bias transistors each having a first source-drain terminal coupled to the input terminals of the power amplifier, a second source-drain terminal coupled to a fixed or adjustable supply voltage, and a gate terminal configured to receive a control voltage via a big resistor. The control voltage may have a tunable voltage level that adjusts the turn on time for the bias transistors.

An aspect of the disclosure provides a radio-frequency power amplifier that includes a first input transistor having a source terminal coupled to a ground power supply line, a gate terminal coupled to a first input terminal, and a drain terminal coupled to a first output terminal; a second input transistor having a source terminal coupled to the ground power supply line, a gate terminal coupled to a second input terminal, and a drain terminal coupled to a second output terminal, the first and second input terminals configured to receive a radio-frequency signal from an antenna; and an amplitude modulation distortion compensation circuit. The amplitude modulation distortion compensation circuit can include a first bias transistor having a first source-drain terminal coupled to the first input terminal, a second source-drain terminal coupled to a voltage line, and a gate terminal; a first resistor having a first terminal coupled to the gate terminal of the first bias transistor and having a second terminal; a second bias transistor having a first source-drain terminal coupled to the second input terminal, a second source-drain terminal coupled to the voltage line, and a gate terminal; and a second resistor having a first terminal coupled to the gate terminal of the second bias transistor and having a second terminal coupled to the second terminal of the first resistor. The power amplifier can optionally include parasitic capacitance neutralization transistors cross-coupled with the input transistors and can optionally include cascode transistors.

The amplitude modulation distortion compensation circuit can further include a first inductor having a first terminal coupled to the first source-drain terminal of the first bias transistor and having a second terminal, a second inductor having a first terminal coupled to the first source-drain terminal of the second bias transistor and having a second terminal directly coupled to the second terminal of the first inductor, and an additional resistor having a first terminal coupled to the second terminals of the first and second inductors and having a second terminal configured to receive a gate voltage. The first and second resistors can each have a resistance that is at least greater than one thousand ohms. The second terminals of the first and second resistors can be configured to receive a fixed or adjustable control voltage that is less than 200 mV or that is less than a threshold voltage of the first and second input transistors. The voltage line that is coupled to the second source-drain terminals of the first and second input transistors can be a positive power supply line or a ground power supply line.

An aspect of the disclosure provides a method of operating a radio-frequency power amplifier. The method can include receiving a radio-frequency signal at a gate terminal of a first input transistor; receiving the radio-frequency signal at a gate terminal of a second input transistor; deactivating a first bias transistor when a voltage swing of the radio-frequency signal is less than a predetermined value, the first bias transistor having a first source-drain terminal coupled to the gate terminal of the first input transistor and having a second source-drain terminal configured to receive a positive power supply voltage; deactivating a second bias transistor when the voltage swing of the radio-frequency signal is less than the predetermined value, the second bias transistor having a first source-drain terminal coupled to the gate terminal of the second input transistor and having a second source-drain terminal configured to receive the positive power supply voltage; and in response to the voltage swing of the radio-frequency signal being greater than the predetermined value, increasing a voltage at the gate terminals of the first and second input transistors by activating the first and second bias transistors. The method can further include providing a control voltage via resistors having a resistance greater than a thousand ohms, to gate terminals of the first and second bias transistors. The method can further include setting a voltage level of the control voltage to less than 200 mV or less than a threshold voltage of the first and second bias transistors.

An aspect of the disclosure provides an electronic device that includes a baseband processor configured to generate baseband signals, a transceiver configured to generate radio-frequency signals based on the baseband signals, and power amplifier circuitry configured to amplify the radio-frequency signals for wireless transmission by an antenna. The power amplifier circuitry can include a first input transistor having a source terminal coupled to a ground line, a drain terminal coupled to a first output terminal, and a gate terminal coupled to a first input terminal; a second input transistor having a source terminal coupled to the ground line, a drain terminal coupled to a second output terminal, and a gate terminal coupled to a second input terminal, the first and second input terminals being coupled to the antenna; and a first source follower transistor having a source terminal coupled to the first input terminal, a drain terminal coupled to a positive power supply line, and a gate terminal; a first resistor having a first terminal coupled to the gate terminal of the first source follower transistor and having a second terminal configured to receive a control voltage; a second source follower transistor having a source terminal coupled to the second input terminal, a drain terminal coupled to the positive power supply line, and a gate terminal; and a second resistor having a first terminal coupled to the gate terminal of the second source follower transistor and having a second terminal configured to receive the control voltage.

The power amplifier circuitry can further include a first inductor having a first terminal coupled to the source terminal of the first source follower transistor and having a second terminal, a second inductor having a first terminal coupled to the source terminal of the second source follower transistor and having a second terminal directly coupled to the second terminal of the first inductor, and a third resistor having a first terminal coupled to the second terminals of the first and second inductors and having a second terminal configured to receive a gate voltage. The first and second resistors can each have a resistance value that is greater than five thousand ohms. The power amplifier circuitry can further include a voltage controller configured to set a voltage level of the control voltage to being less than a threshold voltage level of the first and second source follower transistors. The first and second source follower transistors can be turned off when a voltage swing of a radio-frequency signal at the first and second input terminals is less than a predetermined value and can be turned on when the voltage swing of the radio-frequency signal at the first and second input terminals is greater than the predetermined value.

Further features of the disclosure, its nature and various advantages will be more apparent from the accompanying drawings and following detailed description.

DETAILED DESCRIPTION

An electronic device may be provided with wireless transmitter circuitry. The wireless transmitter circuitry may include a transmitter circuit for outputting a transmit signal, a radio-frequency power amplifier for amplifying the transmit signal, and an antenna for radiating the amplified signal. In practice, the power amplifier may exhibit an amplitude modulation to amplitude modulation (AMAM) distortion caused by an increase in a bias voltage at an input of the power amplifier even at small input voltage swings. To help mitigate or compensate such AMAM distortion, the power amplifier may include an AMAM compensation circuit coupled to the input of the power amplifier. The AMPM compensation circuit may include one or more adaptive biasing source follower transistors that receive a source follower control voltage via large biasing resistors. The source follower control voltage can be tuned so that the adaptive biasing source follower transistors are activated only when the input voltage swing is relatively large. Configuring and operating a radio-frequency power amplifier in this way can help reduce undesired AMAM distortion.

Figure 1:
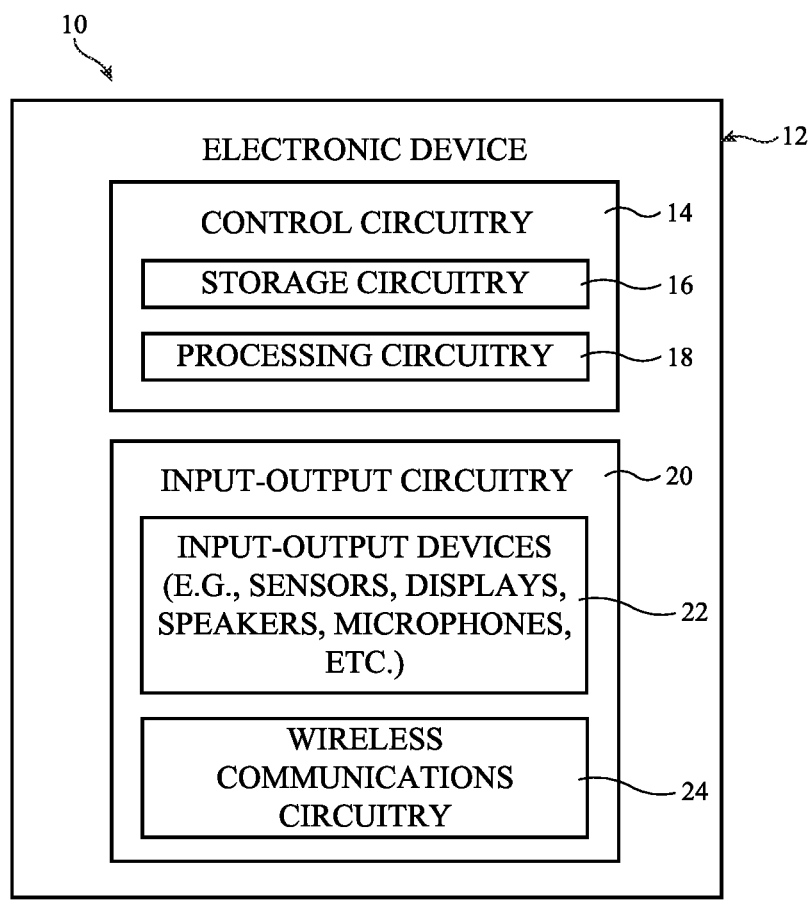
FIG. 1 is a diagram of an illustrative electronic device having wireless communications circuitry in accordance with some embodiments.

FIG. 1 is a diagram of an electronic device such as electronic device 10 that can be provided with such wireless transmitter circuitry. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless communications circuitry such as wireless communications circuitry 24 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include baseband processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands," and may span corresponding ranges of frequencies. In general, the radio-frequency transceiver circuitry within wireless circuitry 24 may cover (handle) any desired frequency bands of interest.

Figure 2:
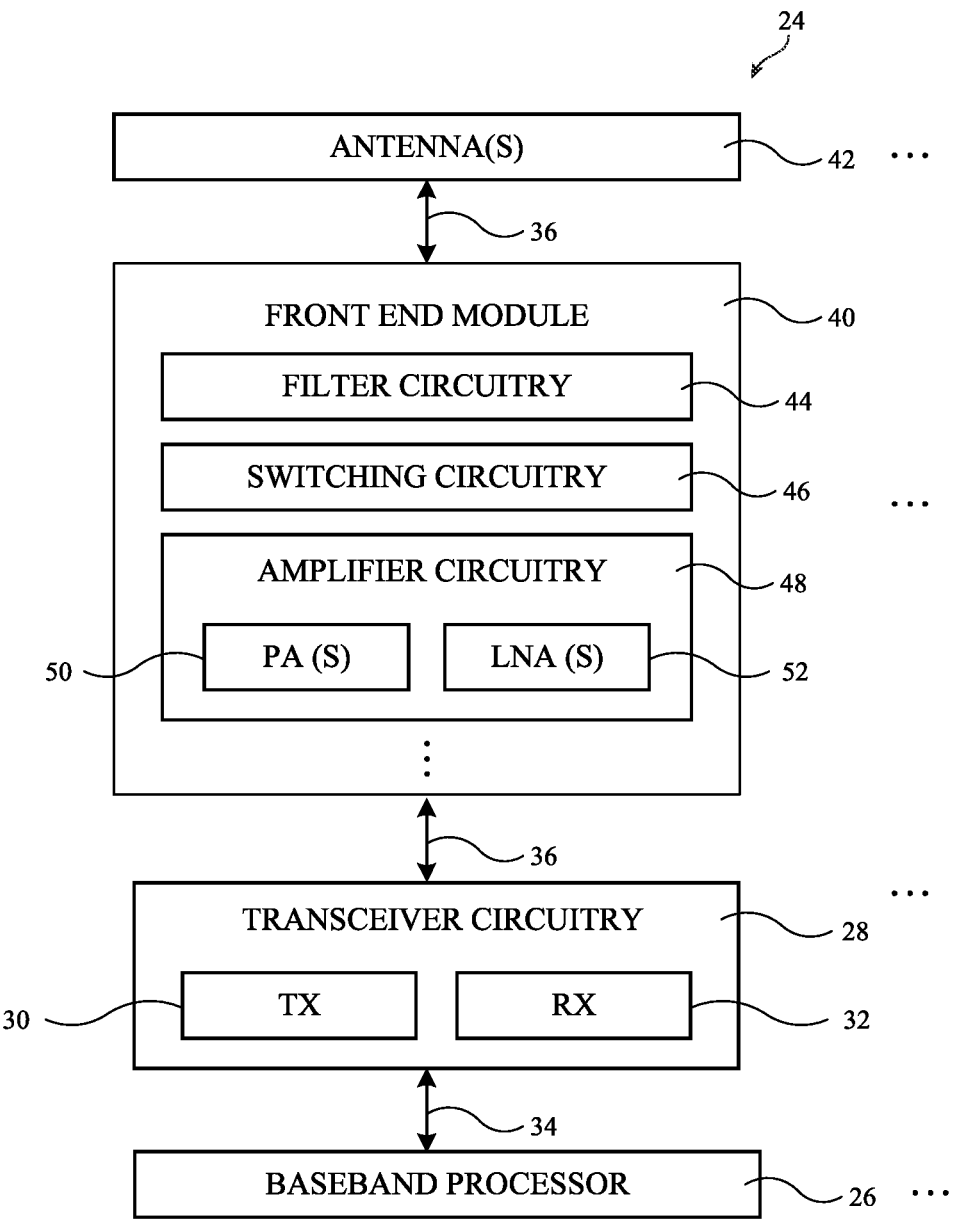
FIG. 2 is a diagram of illustrative wireless communications circuitry having amplifier circuitry in accordance with some embodiments.

FIG. 2 is a diagram showing illustrative components within wireless circuitry 24. As shown in FIG. 2, wireless circuitry 24 may include a baseband processor such as baseband processor 26, radio-frequency (RF) transceiver circuitry such as radio-frequency transceiver 28, radio-frequency front end circuitry such as radio-frequency front end module (FEM) 40, and antenna(s) 42. Baseband processor 26 may be coupled to transceiver 28 over baseband path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single baseband processor 26, a single transceiver 28, a single front end module 40, and a single antenna 42 for the sake of clarity. In general, wireless circuitry 24 may include any desired number of baseband processors 26, any desired number of transceivers 28, any desired number of front end modules 40, and any desired number of antennas 42. Each baseband processor 26 may be coupled to one or more transceiver 28 over respective baseband paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, baseband processor 26 may provide baseband signals to transceiver 28 over baseband path 34. Transceiver 28 may further include circuitry for converting the baseband signals received from baseband processor 26 into corresponding radio-frequency signals. For example, transceiver circuitry 28 may include mixer circuitry for up-converting (or modulating) the baseband signals to radio-frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to baseband processor 26 over baseband path 34. Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband processor 26 and/or portions of transceiver 28 (e.g., a host processor on transceiver 28) may form a part of control circuitry 14. Control circuitry 14 (e.g., portions of control circuitry 14 formed on baseband processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path. A power amplifier 50 (sometimes referred to as radio-frequency power amplifier circuitry, transmit amplifier circuitry, or amplifier circuitry) may be configured to amplify a radio-frequency signal without changing the signal shape, format, or modulation. Power amplifier 50 may, for example, be used to provide 10 dB of gain, 20 dB of gain, 10-20 dB of gain, less than 20 dB of gain, more than 20 dB of gain, or other suitable amounts of gain.

Figure 3:
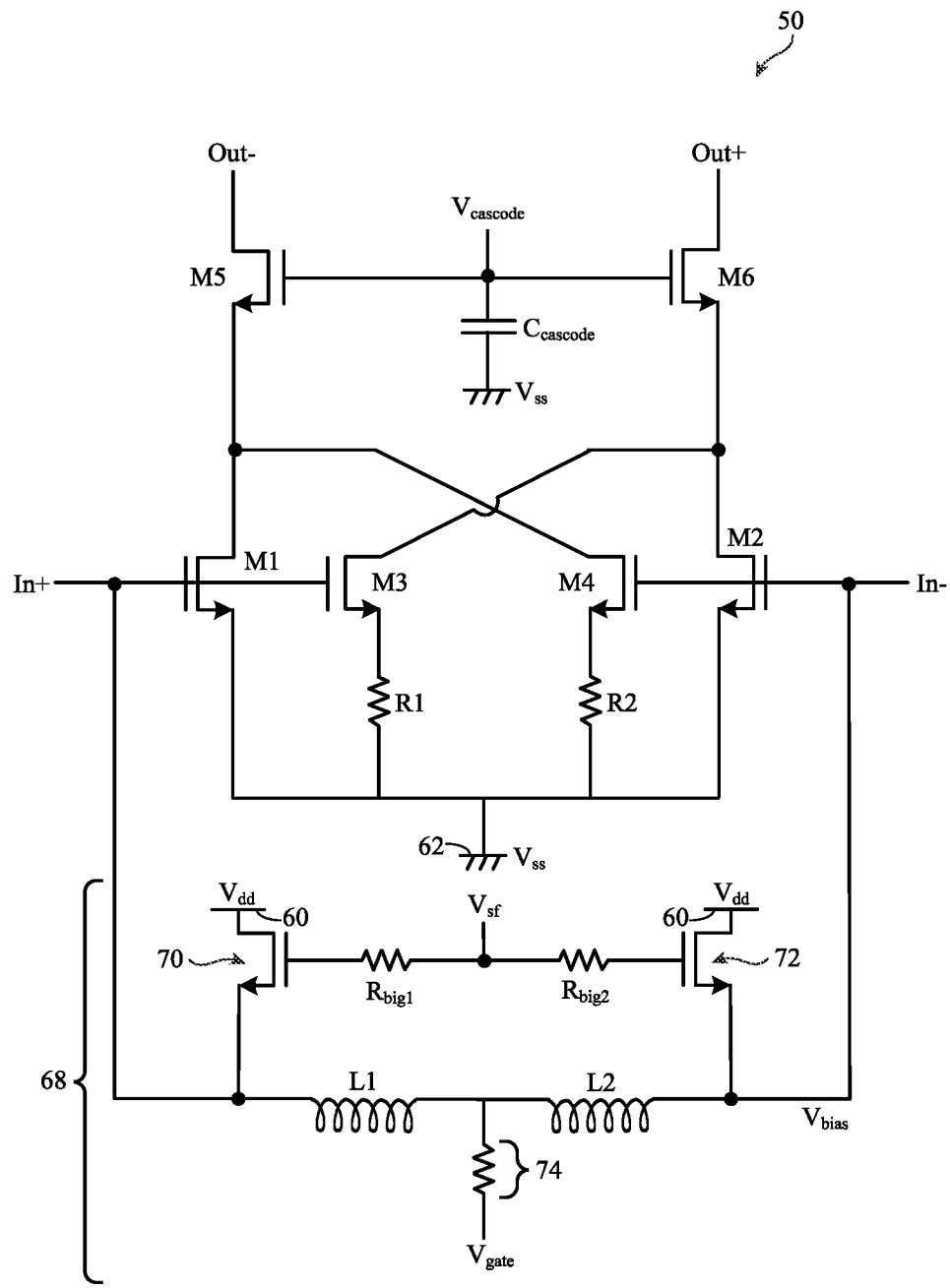
FIG. 3 is a diagram of an illustrative power amplifier having an amplitude modulation to amplitude modulation (AMAM) compensation circuit in accordance with some embodiments.

FIG. 3 is a circuit diagram showing one implementation of power amplifier 50. As shown in FIG. 3, power amplifier 50 may include at least transistors M1, M2, M3, M4, M5, and M6, resistors R1 and R2, and capacitor Ccascode. Transistors M1-M6 may be n-type (n-channel) transistors such as n-type metal-oxide-semiconductor (NMOS) devices. Transistor M1 may have a source terminal coupled to a ground power supply line 62 (e.g., a ground line on which ground power supply voltage Vss is provided), a drain terminal, and a gate terminal coupled to a positive input terminal In+. Transistor M2 may have a source terminal coupled to ground power supply line 62, a drain terminal, and a gate terminal coupled to a negative input terminal In−. Input terminals In+ and In− serve collectively as the differential input port of power amplifier 50 that is coupled to one or more antennas 42, so transistors M1 and M2 are sometimes referred to as the input transistors. The terms "source" and "drain" terminals used to refer to current-conveying terminals in a transistor may be used interchangeably and are sometimes referred to as "source-drain" terminals. Thus, the source terminal of transistor M1 can sometimes be referred to as a first source-drain terminal, and the drain terminal of transistor M1 can be referred to as a second source-drain terminal (or vice versa).

Transistor M3 may have a source terminal coupled to ground power supply line 62 via resistor R1, a gate terminal coupled to positive input terminal In+, and a drain terminal cross-coupled to the drain terminal of input transistor M2. Transistor M4 may have a source terminal coupled to ground power supply line 62 via resistor R2, a gate terminal coupled to negative input terminal In−, and a drain terminal cross-coupled to the drain terminal of input transistor M1. Configured in this way, cross-coupled transistors M3 and M4 can be used to neutralize the gate-to-drain parasitic capacitance of input transistors M1 and M2 and are therefore sometimes referred to as parasitic capacitance neutralization transistors. Resistors R1 and R2 are sometimes referred to as source resistors. The use of parasitic capacitance neutralization transistors M3 and M4 (and the corresponding resistors R1 and R2) are optional.

Transistor M5 may have a source terminal coupled to the drain terminal of input transistor M1, a gate terminal configured to receive a cascode voltage Vcascode, and a drain terminal coupled to a negative amplifier output terminal Out−. Transistor M6 may have a source terminal coupled to the drain terminal of input transistor M2, a gate terminal configured to receive cascode voltage Vcascode, and a drain terminal coupled to a positive amplifier output terminal Out+. Output terminals Out+ and Out−, sometimes referred to as power amplifier output terminals, serve collectively as the differential output port of power amplifier 50. A shunt capacitor Ccascode may be attached to the gate terminals of transistors M5 and M6. Voltage Vcascode may have some intermediate voltage level between ground voltage level Vss and a positive power supply voltage Vdd. If desired, voltage Vcascode may also be equal to positive power supply voltage Vdd.

Transistors M5 and M6 interposed between the drain terminals of the input transistors and the differential output port in this way are sometimes referred to collectively as cascode transistors. A cascode transistor (stage) can be defined as an amplifier stage with an amplifying transistor that has its gate terminal coupled to a common (fixed) voltage source (e.g., Vcascode). The cascode transistor stage with M5 and M6 may be used to increase the output impedance of power amplifier 50 and can optionally be used to provide different gain steps (e.g., by selectively adjusting the drive strength of transistors M5 and M6). The use of cascode transistors M5 and M6 are optional (e.g., the drain terminal of input transistor M1 can be directly connected to negative output terminal Out− without any intervening cascode transistor M5, and the drain terminal of input transistor M2 can be directly connected to positive output terminal Out+ without any intervening cascode transistor M6).

The performance of a radio-frequency power amplifier is sometimes quantified by a parameter kΩown as error vector magnitude (EVM). Ideally, a signal transmitted by a power amplifier would have signal modulation constellation points at certain ideal locations on a complex plane. Due to design imperfections, distortion, spurious signals, and/or noise, however, the actual constellation points often deviate from the ideal locations. Error vector magnitude is a measure of how far the actual points deviate from the ideal locations.

Amplifiers, in general, have a linear operating range and a non-linear operating range. To avoid signal distortion, amplifiers are often operated in the linear range. When operated in the non-linear range, the ratio of input power to output power may not be constant. Thus, as the input signal amplitude increases, a disproportionate increase in the output signal amplitude may occur. This unwanted additional amplitude modulation due to the non-linear characteristics of the amplifier is sometimes referred to as amplitude modulation to amplitude modulation (AMAM) distortion. Similar to the output signal amplitude, the output phase of an amplifier may change disproportionately as the input signal amplitude increases. This unwanted additional amount of phase modulation due to the non-linear characteristics of the amplifier is sometimes referred to as amplitude modulation to phase modulation (AMPM) distortion.

To improve EVM, it is generally desirable to reduce AMAM and AMPM distortion. One conventional way of compensating for AMAM and AMPM distortion is using digital predistortion. The use of digital predistortion, however, is not always possible. In millimeter wave wireless applications, however, analog predistortion operations may be more practical to help compensate for AMAM distortion. Analog predistortion may, however, require reducing the bias of an amplifier and as a result, reduce or otherwise undesirably limit the gain of the power amplifier.

To help compensate or mitigate any unwanted AMAM distortion, power amplifier 50 may be provided with a compensation circuit such as AMAM compensation circuit 68. Compensation circuit 68 is sometimes referred to as an AMAM distortion compensation circuit or an amplitude modulation distortion compensation circuit. Compensation circuit 68 may include a first source follower transistor such as source follower transistor 70, a second source follower transistor such as source follower transistor 72, resistors Rbig1, Rbig2, and 74, and inductors L1 and L2. Source follower transistor 70 may be an NMOS transistor having a drain terminal coupled to positive power supply line 60 (e.g., a positive power supply terminal on which positive power supply voltage Vdd is provided), a source terminal coupled to the positive amplifier input terminal In+, and a gate terminal. Source follower transistor 72 may be an NMOS transistor having a drain terminal coupled to positive power supply line 60, a source terminal coupled to the negative amplifier input terminal In−, and a gate terminal.

Inductor L1 may have a first terminal coupled to the source terminal of first source follower transistor 70 and a second terminal. Inductor L2 may have a first terminal coupled to the source terminal of second source follower transistor 72 and a second terminal coupled to the first terminal of inductor L1. Inductors L1 and L2 may sometimes be referred to as source inductors. Resistor 74 may have a first terminal coupled to the second terminals of inductors L1 and L2 and a second terminal configured to receive a gate voltage Vgate. Voltage Vgate can be any fixed or adjustable voltage for establishing a direct-current (DC) or steady state bias voltage level for the input terminals of amplifier 50.

Figure 5:
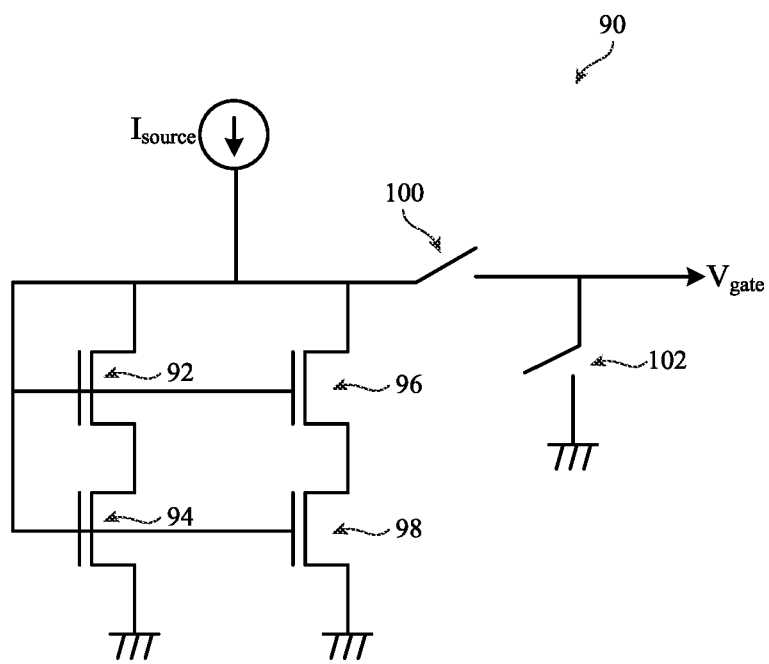
FIG. 5 is a circuit diagram of an illustrative stacked diode gate voltage generator in accordance with some embodiments.

FIG. 5 is a diagram of a circuit such as circuit 90 configured to generate Vgate. As shown in FIG. 5, circuit 90 may include a current source such as current source Isource, re-channel transistors (e.g., NMOS devices) such as transistors 92, 94, 96, and 98, and switches 100 and 102. Transistor 92 may have a drain terminal coupled to the current source, a gate terminal coupled to its drain terminal, and a source terminal. Transistor 94 may have a drain terminal coupled to the source terminal of transistor 92, a gate terminal coupled to the gate of transistor 92, and a source terminal coupled to the ground power supply line. Transistor 96 may have a drain terminal coupled to the current source, a gate terminal coupled to its drain terminal, and a source terminal. Transistor 98 may have a drain terminal coupled to the source terminal of transistor 96, a gate terminal coupled to the gate of transistor 94, and a source terminal coupled to the ground power supply line.

Switch 100 can be selectively activated to connect the drain terminals of transistors 92 and 96 to the output of circuit 90 on which voltage Vgate is generated. Switch 102 can be selectively activated to shunt the output of circuit 90 to ground. Transistors 92 and 94 are said to be stacked in series. Similarly, transistors 96 and 98 are also said to be stacked transistors. Transistors 92 and 96 having gate terminals shorted to their drain terminals are said to be diode-connected transistors. Thus, circuit 90 is sometimes referred to as a stacked diode gate voltage generator. The stacked diode configuration of circuit 90 as shown in FIG. 5 is merely illustrative. In general, gate voltage generator 90 can be implemented using other types of voltage generator or voltage regulator architectures.

Referring back to FIG. 3, resistor Rbig1 may have a first terminal coupled to the gate of first source follower transistor 70 and a second terminal configured to receive a source follower control voltage Vsf. Resistor Rbig2 may have a first terminal coupled to the gate of second source follower transistor 72 and a second terminal configured to receive source follower control voltage Vsf. Resistors Rbig1 and Rbig2 should each have a relatively large resistance value. For example, resistors Rbig1 and Rbig2 can each have a resistance value that is at least 1 kΩ, at least 5 kΩ, at least 10 kΩ, 1-10 kΩ, 100 kΩ, 10-100 kΩ, or more than 100 kΩ. Source follower control voltage Vsf may be a fixed voltage or an adjustable voltage. Source follower control voltage Vsf may be set to a low voltage such as 0 V, 60 mV, 120 mV, less than 50 mV, less than 100 mV, less than 150 mV, less than 200 mV, less than 300 mV, less than 5% of Vdd, less than 10% of Vdd, less than 15% of Vdd, less than 20% of Vdd, 1-10% of Vdd, a negative voltage, or a voltage level that is less than the threshold voltage of the source follower transistors (e.g., Vsf should be less than the threshold voltage of transistors 70 and 72).

Figure 4:
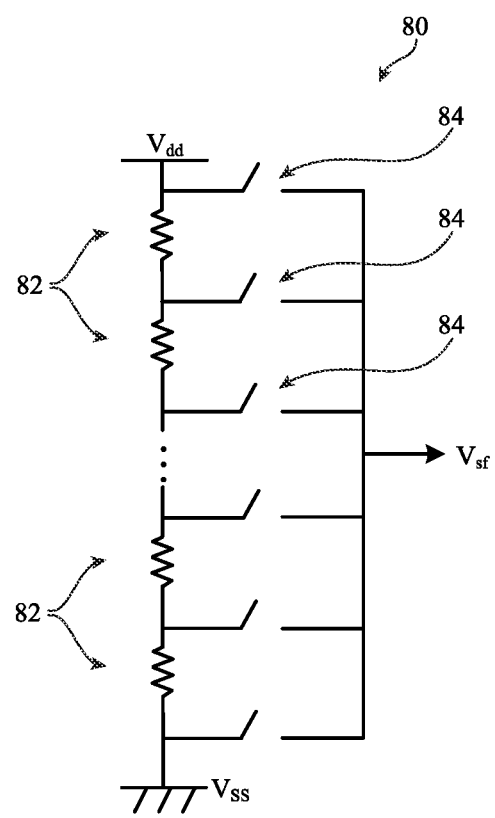
FIG. 4 is a circuit diagram of an illustrative voltage digital-to-analog converter in accordance with some embodiments.

FIG. 4 is a circuit diagram showing a source follower control voltage generation circuit 80 implemented as a voltage digital-to-analog converter (VDAC). As shown in FIG. 4, circuit 80 may include a string of resistors 82 connected in series between a positive power supply line (e.g., a positive terminal on which positive power supply voltage Vdd is provided) and a ground line power supply line (e.g., a ground terminal on which ground voltage Vss is provided). Circuit 80 may include switches 84 coupled to respective intermediate notes along the string of resistors 82. A selective one of switches 84 may be activated to tap into a certain point along the voltage divider of the resistor chain to generate a corresponding source follower control voltage Vsf. As an example, to set voltage Vsf equal to Vss or 0 V, the bottommost switch 84 can be activated while the remaining switches are disabled. As another example, to set voltage Vsf equal to Vdd or 1.8 V, the topmost switch 84 can be enabled while the remaining switches are deactivated. Any one of the switches 84 between the bottommost and topmost switch can be turned on to select an intermediate voltage level between Vss and Vdd. The embodiment of FIG. 4 in which Vsf generation circuit 80 is implemented as a voltage DAC is merely illustrative. If desired, other types of adjustable voltage generation circuit or voltage control circuit can be used. As yet another example, the Vsf node can be hard wired to ground (e.g., Vsf may be fixed to Vss), obviating the need for a VDAC.

By setting Vsf to a relatively low voltage level and by using relatively large resistors Rbig1 and Rbig2, source follower transistors 70 and 72 are not easily turned on (see FIG. 3). Source follower transistors 70 and 72 are only turned on when the voltage swing of an input signal across input terminals In+ and In− is relatively large (e.g., when the input voltage swing is greater than the threshold voltage of the source follower transistors or when the input voltage swing is greater than some predetermined value). At small input voltage swings (e.g., when the input voltage swing is less than the threshold voltage of the source follower transistors or when the input voltage swing is less the predetermined value), source follower transistors 70 and 72 are turned off (deactivated) so there is no DC current flowing through transistors 70 and 72. At larger input voltage swings, source follower transistors 70 and 72 can be turned on (activated), which charges up an input bias voltage Vbias at the input of power amplifier 50. In other words, the DC bias point Vbias of the amplifier input terminal only increases when the input voltage swing is large or when the input power is relatively high. Compensation circuit 68 configured to change the bias voltage Vbias at the input of amplifier 50 depending on the magnitude of the input voltage swing in this way is therefore sometimes referred to as an adaptive voltage biasing circuit. Transistors 70 and 72 are sometimes referred to as adaptive biasing transistors or bias transistors. Control voltage Vsf can be tuned to adjust the turn on threshold for source follower transistors 70 and 72.

Figure 6:
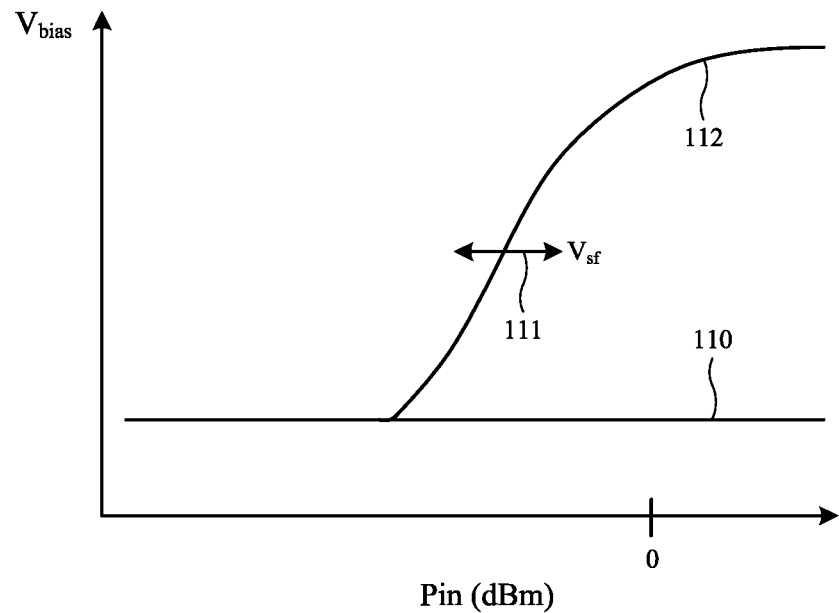
FIG. 6 is a plot showing how an input transistor gate bias voltage can vary as a function of input power in accordance with some embodiments.

FIG. 6 is a plot showing how an input transistor gate bias voltage Vbias can vary as a function of input power. Line 110 represents the behavior of Vbias if power amplifier 50 does not include compensation circuit 68 or if compensation circuit 68 is disabled. As shown by line 110, voltage Vbias will stay constant across different input power levels. Line 112 represents the behavior of Vbias for power amplifier 50 that includes compensation circuit 68 or if compensation circuit 68 is enabled. As shown by line 112, voltage Vbias will begin rising as input power level increases. This rise in Vbias occurs because, at higher input power levels, the input voltage swing is greater, which causes the source follower transistors 70 and 72 to turn on and pull up Vbias. The point at which Vbias starts to increase can be tuned by adjusting the source follower control voltage Vsf, as shown by arrow 111. At larger Vsf voltage levels, Vbias will rise earlier (i.e., Vbias will start increasing at lower input power levels). At smaller Vsf voltage levels, Vbias will rise later (i.e., Vbias will start increasing at high input power levels).

Figure 7:
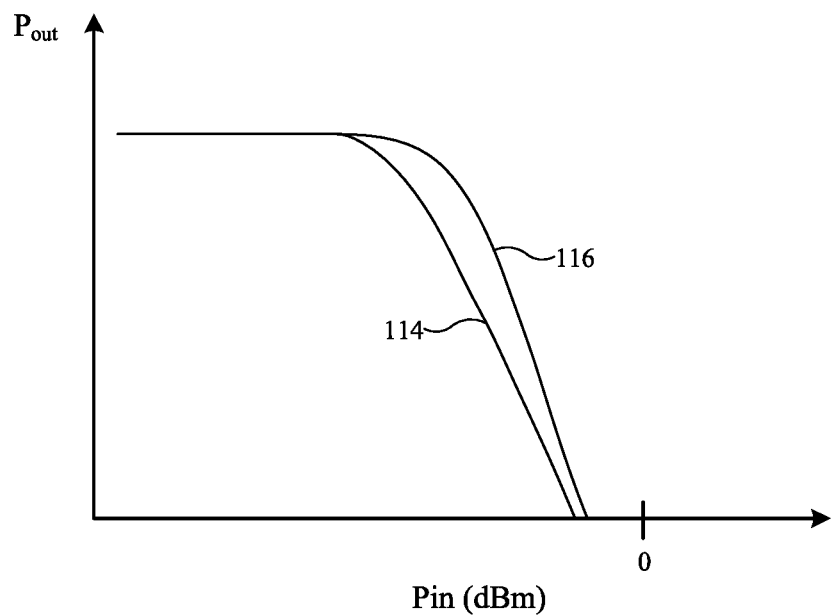
FIG. 7 is a plot showing how output power can vary as a function of input power in accordance with some embodiments.

FIG. 7 is a plot showing how output power Pout can vary as a function of input power. Curve 114 represents the behavior of Pout if power amplifier 50 does not include compensation circuit 68 or if compensation circuit 68 is disabled. Curve 116 represents the behavior of Pout for power amplifier 50 that includes compensation circuit 68 or if compensation circuit 68 is enabled. The input power level at which Pout starts to roll off or starts to decrease is sometimes referred to as the power saturation point. As shown in FIG. 7, the use of compensation circuit 68 can help extend or push out the power saturation point so that Pout starts rolling off at a higher input power level. Increasing the power saturation point in this way can help compensate for undesirable AMAM distortion without exacerbating AMPM distortion.

Figure 8:
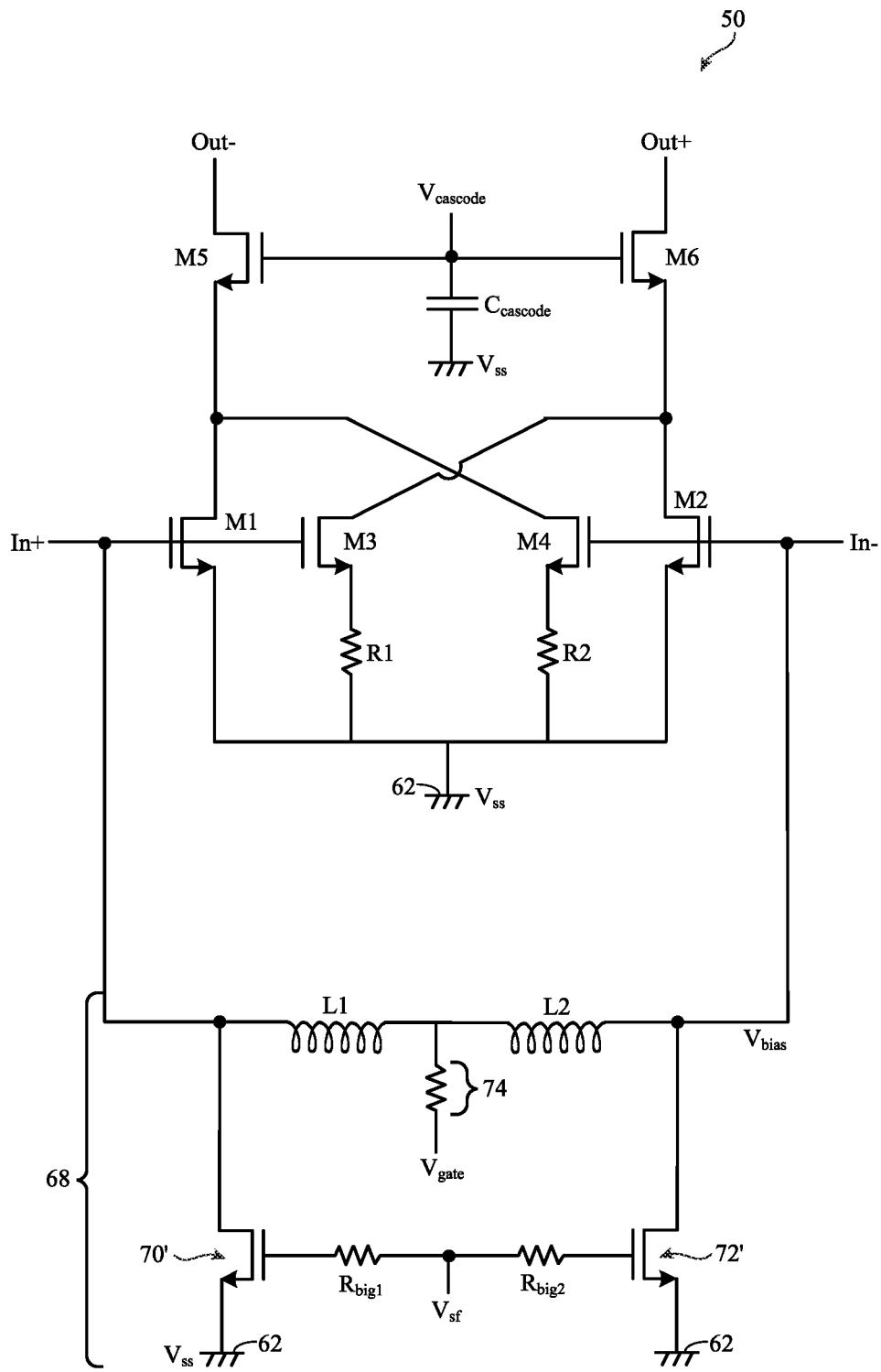
FIG. 8 is a diagram of an illustrative power amplifier having an AMAM compensation circuit with pull-down transistors in accordance with some embodiments.

The embodiment of FIG. 3 in which AMAM compensation circuit 68 includes source follower transistors configured to pull up voltage Vbias at higher voltage swing levels is merely illustrative. In other embodiments, it may be desirable to pull down or decrease voltage Vbias at higher voltage swings. FIG. 8 illustrates another implementation of power amplifier 50 having a compensation circuit 68 with pull-down transistors 70' and 72'. Pull-down transistor 70' may be an NMOS transistor having a source terminal coupled to ground power supply line 62 (e.g., a ground terminal on which ground voltage Vss is provided), a drain terminal coupled to the positive amplifier input terminal In+, and a gate terminal. Pull-down transistor 72' may be an NMOS transistor having a source terminal coupled to ground power supply line 62, a drain terminal coupled to the negative amplifier input terminal In−, and a gate terminal. Inductor L1 may have a first terminal coupled to the drain terminal of first pull-down transistor 70' and a second terminal. Inductor L2 may have a first terminal coupled to the drain terminal of second source follower transistor 72' and a second terminal coupled to the first terminal of inductor L1. Resistor 74 may have a first terminal coupled to the second terminals of inductors L1 and L2 and a second terminal configured to receive a gate voltage Vgate. Voltage Vgate can be any fixed or adjustable voltage for establishing a direct-current (DC) or steady state bias voltage level for the input terminals of amplifier 50. Voltage Vgate can be generated using a stacked diode voltage generation circuit as shown in FIG. 5 or other types of voltage generation circuit or voltage controller.

Resistor Rbig1 may have a first terminal coupled to the gate of first pull-down transistor 70' and a second terminal configured to receive control voltage Vsf. Resistor Rbig2 may have a first terminal coupled to the gate of second pull-down transistor 72' and a second terminal configured to receive control voltage Vsf. Resistors Rbig1 and Rbig2 should each have a relatively large resistance value. For example, resistors Rbig1 and Rbig2 can each have a resistance value that is at least 1 kΩ, at least 5 kΩ, at least 10 kΩ, 1-10 kΩ, 100 kΩ, 10-100 kΩ, or more than 100 kΩ. Control voltage Vsf may be a fixed voltage or an adjustable voltage that is generated by a VDAC shown in FIG. 4 or other types of control voltage generation circuit or voltage controller. Control voltage Vsf may be set to a low voltage such as 0 V, 60 mV, 120 mV, less than 50 mV, less than 100 mV, less than 150 mV, less than 200 mV, less than 300 mV, less than 5% of Vdd, less than 10% of Vdd, less than 15% of Vdd, less than 20% of Vdd, 1-10% of Vdd, a negative voltage, or a voltage level that is less than the threshold voltage of the pull-down transistors (e.g., Vsf should be less than the threshold voltage of transistors 70' and 72'). The remaining structure of power amplifier 50 is identical to that already described with respect to FIG. 3 and need not be reiterated to avoid obscuring the present embodiment.

By setting Vsf to a relatively low voltage level and by using relatively large resistors Rbig1 and Rbig2, pull-down transistors 70' and 72' are not easily turned on. Pull-down transistors 70' and 72' are only turned on when the voltage swing of an input signal across input terminals In+ and In− is relatively large (e.g., when the input voltage swing is greater than the threshold voltage of the pull-down transistors). At small input voltage swings (e.g., when the input voltage swing is less than the threshold voltage of the pull-down transistors), transistors 70' and 72' are turned off (deactivated) so there is no DC current flowing through transistors 70' and 72'. At larger input voltage swings, pull-down transistors 70' and 72' can be turned on (activated), which discharges or drives the input bias voltage Vbias towards ground. In other words, the DC bias point Vbias of the amplifier input terminal only decreases when the input voltage swing is large or when the input power is relatively high. Compensation circuit 68 configured to change the bias voltage Vbias at the input of amplifier 50 depending on the magnitude of the input voltage swing in this way is therefore sometimes referred to as an adaptive voltage biasing circuit. Control voltage Vsf can be tuned to adjust the turn on threshold for pull-down transistors 70' and 72'.

Figure 9:
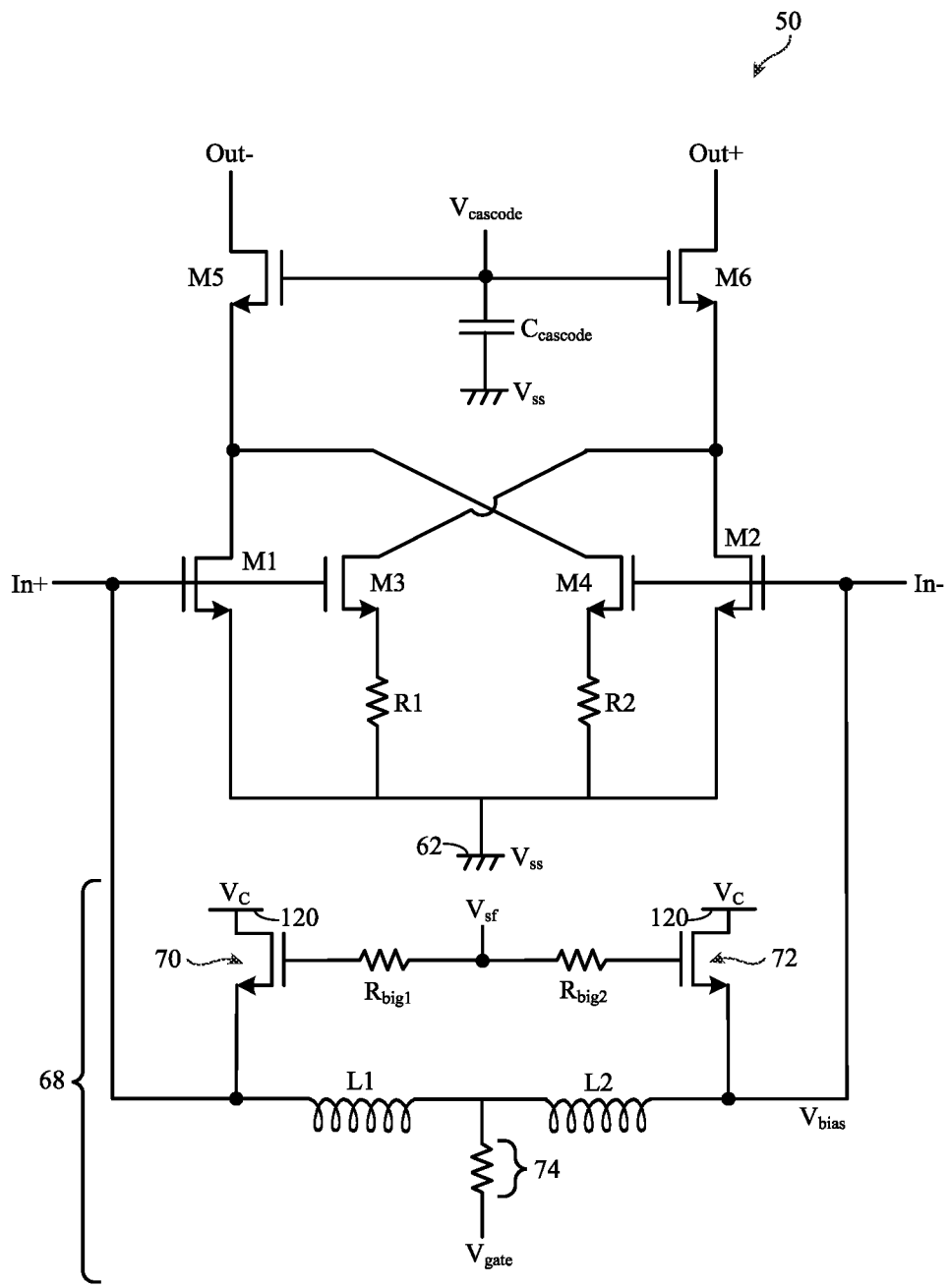
FIG. 9 is a diagram of an illustrative power amplifier having an AMAM compensation circuit coupled to an adjustable supply voltage in accordance with some embodiments.

The example of FIG. 3 in which compensation circuit 68 includes transistors 70 and 72 coupled to positive power supply voltage Vdd and the example of FIG. 8 in which compensation circuit 68 includes transistors 70' and 72' coupled to ground power supply voltage Vss are merely illustrative and are not intended to limit the scope of the present embodiments. FIG. 9 shows another implementation of power amplifier 50 having compensation circuit 68 having transistors 70 and 72 having a drain terminal coupled to a voltage control line 120 on which voltage Vc is provided. Voltage Vc may be a fixed voltage or an adjustable voltage. Voltage Vc may be set equal to Vdd, Vss, greater than Vdd, less than Vss, or some other voltage level between Vss and Vdd. Voltage Vc can be selected so that transistors 70 and 72 are used to pull up or pull down Vbias towards Vc when they are turned on. The remainder of compensation circuit 68 is identical to that already described in connection with FIG. 3 and need not be reiterated in detail for the sake of clarity.

The methods and operations described above in connection with FIGS. 1-9 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. A radio-frequency power amplifier comprising:
    a first input transistor having a source terminal coupled to a ground power supply line, a gate terminal coupled to a first input terminal, and a drain terminal coupled to a first output terminal;
    a second input transistor having a source terminal coupled to the ground power supply line, a gate terminal coupled to a second input terminal, and a drain terminal coupled to a second output terminal, the first and second input terminals configured to receive a radio-frequency signal from an antenna; and
    an amplitude modulation distortion compensation circuit that includes
        a first bias transistor having a first source-drain terminal coupled to the first input terminal, a second source-drain terminal coupled to a voltage line different than the drain terminal of the second input transistor, and a gate terminal,
        a first resistor having a first terminal coupled to the gate terminal of the first bias transistor and having a second terminal,
        a second bias transistor having a first source-drain terminal coupled to the second input terminal, a second source-drain terminal coupled to the voltage line different than the drain terminal of the first input transistor, and a gate terminal, and
        a second resistor having a first terminal coupled to the gate terminal of the second bias transistor and having a second terminal coupled to the second terminal of the first resistor.

2. The radio-frequency power amplifier of claim 1, further comprising:
    a first capacitance neutralization transistor having a source terminal coupled to the ground power supply line via a first source resistor, a drain terminal coupled to the drain terminal of the second input transistor, and a gate terminal coupled to the first input terminal; and
    a second capacitance neutralization transistor having a source terminal coupled to the ground power supply line via a second source resistor, a drain terminal coupled to the drain terminal of the first input transistor, and a gate terminal coupled to the second input terminal.

3. The radio-frequency power amplifier of claim 1, further comprising:
    a first cascode transistor having a first source-drain terminal coupled to the drain terminal of the first input transistor, a second source-drain terminal coupled to the first output terminal, and a gate terminal;
    a second cascode transistor having a first source-drain terminal coupled to the drain terminal of the second input transistor, a second source-drain terminal coupled to the second output terminal, and a gate terminal coupled to the gate terminal of the first cascode transistor; and
    a capacitor having a first terminal coupled to the gate terminals of the first and second cascode transistors and having a second terminal coupled to the ground power supply line.

4. The radio-frequency power amplifier of claim 1, wherein the amplitude modulation distortion compensation circuit further comprises:
a first inductor having a first terminal coupled to the first source-drain terminal of the first bias transistor and having a second terminal;
a second inductor having a first terminal coupled to the first source-drain terminal of the second bias transistor and having a second terminal directly coupled to the second terminal of the first inductor; and
an additional resistor having a first terminal coupled to the second terminals of the first and second inductors and having a second terminal configured to receive a gate voltage.

5. The radio-frequency power amplifier of claim 1, wherein the first and second resistors each have a resistance that is at least one thousand ohms.

6. The radio-frequency power amplifier of claim 1, wherein the second terminals of the first and second resistors are configured to receive a control voltage that is less than a threshold voltage of the first and second input transistors.

7. The radio-frequency power amplifier of claim 6, wherein the amplitude modulation distortion compensation circuit further comprises a voltage digital-to-analog converter configured to generate the control voltage.

8. The radio-frequency power amplifier of claim 1, wherein the second terminals of the first and second resistors are configured to receive a fixed control voltage.

9. The radio-frequency power amplifier of claim 1, wherein the second terminals of the first and second resistors are configured to receive an adjustable control voltage.

10. The radio-frequency power amplifier of claim 1, wherein the second terminals of the first and second resistors are configured to receive a control voltage that is less than 200 millivolt (mV).

11. The radio-frequency power amplifier of claim 1, wherein the voltage line that is coupled to the second source-drain terminals of the first and second input transistors is a power supply line.

12. A method of operating a radio-frequency power amplifier, the method comprising:
receiving a radio-frequency signal at a gate terminal of a first input transistor;
receiving the radio-frequency signal at a gate terminal of a second input transistor;
deactivating a first bias transistor when a voltage swing of the radio-frequency signal is less than a predetermined value, the first bias transistor having a first source-drain terminal coupled to the gate terminal of the first input transistor and having a second source-drain terminal configured to receive a positive power supply voltage;
deactivating a second bias transistor when the voltage swing of the radio-frequency signal is less than the predetermined value, the second bias transistor having a first source-drain terminal coupled to the gate terminal of the second input transistor and having a second source-drain terminal configured to receive the positive power supply voltage; and
in response to the voltage swing of the radio-frequency signal being greater than the predetermined value, increasing a voltage at the gate terminals of the first and second input transistors by activating the first and second bias transistors.

13. The method of claim 12, further comprising:
providing a control voltage, via a first resistor, to a gate terminal of the first bias transistor; and
providing the control voltage, via a second resistor, to a gate terminal of the second bias transistor.

14. The method of claim 13, further comprising:
setting a voltage level of the control voltage to less than 200 millivolt (mV).

15. The method of claim 13, further comprising:
setting a voltage level of the control voltage to less than a threshold voltage of the first and second bias transistors.

16. An electronic device comprising:
one or more processors configured to generate digital signals;
a transceiver configured to generate radio-frequency signals based on the digital signals; and
power amplifier circuitry configured to amplify the radio-frequency signals for wireless transmission by an antenna, the power amplifier circuitry including
a first input transistor having a source terminal coupled to a ground line, a drain terminal coupled to a first output terminal, and a gate terminal coupled to a first input terminal,
a second input transistor having a source terminal coupled to the ground line, a drain terminal coupled to a second output terminal, and a gate terminal coupled to a second input terminal, the first and second input terminals being coupled to the antenna,
a first source follower transistor having a source terminal coupled to the first input terminal, a drain terminal coupled to a positive power supply line, and a gate terminal,
a first resistor having a first terminal coupled to the gate terminal of the first source follower transistor and having a second terminal configured to receive a control voltage,
a second source follower transistor having a source terminal coupled to the second input terminal, a drain terminal coupled to the positive power supply line, and a gate terminal,
a second resistor having a first terminal coupled to the gate terminal of the second source follower transistor and having a second terminal configured to receive the control voltage,
a first inductor having a first terminal coupled to the source terminal of the first source follower transistor and having a second terminal, and
a second inductor having a first terminal coupled to the source terminal of the second source follower transistor and having a second terminal directly coupled to the second terminal of the first inductor.

17. The electronic device of claim 16, the power amplifier circuitry further comprising:
a third resistor having a first terminal coupled to the second terminals of the first and second inductors and having a second terminal configured to receive a gate voltage.

18. The electronic device of claim 16, wherein the first and second resistors each have a resistance value that is at least five thousand ohms.

19. The electronic device of claim 16, further comprising:
a voltage controller configured to set a voltage level of the control voltage to being less than a threshold voltage level of the first and second source follower transistors.

20. The electronic device of claim 16, wherein:
the first and second source follower transistors are turned off when a voltage swing of a radio-frequency signal at the first and second input terminals is less than a predetermined value; and the first and second source follower transistors are turned on when the voltage swing of the radio-frequency signal at the first and second input terminals is greater than the predetermined value.

* * * * *